(12) United States Patent
Jang et al.

(10) Patent No.: US 9,395,830 B2
(45) Date of Patent: Jul. 19, 2016

(54) WIRED ELECTRODE OF TOUCH SCREEN PANEL

(75) Inventors: Kyung Hyun Jang, Cheongju (KR); Hyung Bae Choi, Mungyeong (KR); Sung Jin Ryu, Cheongju (KR); Ki Won Park, Anyang (KR)

(73) Assignee: Mirae Nano Technologies Co., Ltd., Cheongwon-gun (KR)

( * ) Notice: Subject to any disclaimer, the term of this patent is extended or adjusted under 35 U.S.C. 154(b) by 207 days.

(21) Appl. No.: 14/125,566

(22) PCT Filed: Jun. 15, 2012

(86) PCT No.: PCT/KR2012/004719
§ 371 (c)(1),
(2), (4) Date: Dec. 11, 2013

(87) PCT Pub. No.: WO2012/173420
PCT Pub. Date: Dec. 20, 2012

(65) Prior Publication Data
US 2014/0131075 A1    May 15, 2014

(30) Foreign Application Priority Data
Jun. 15, 2011 (KR) .......... 10-2011-0057992

(51) Int. Cl.
*H05K 1/00*    (2006.01)
*G06F 3/041*    (2006.01)
*G06F 3/044*    (2006.01)
*G06F 3/046*    (2006.01)
(Continued)

(52) U.S. Cl.
CPC .............. *G06F 3/041* (2013.01); *G06F 3/044* (2013.01); *G06F 3/046* (2013.01); *H05K 1/0296* (2013.01); *H05K 3/1258* (2013.01); *G06F 2203/04103* (2013.01); *H05K 2201/09036* (2013.01); *H05K 2201/09045* (2013.01); *H05K 2203/0108* (2013.01)

(58) Field of Classification Search
CPC .......... H05K 2201/09472; H05K 2201/09045; H05K 3/107; H05K 2201/09054
See application file for complete search history.

(56) References Cited

U.S. PATENT DOCUMENTS 7,630,207 B2    12/2009 Kojima
7,724,241 B2    5/2010 Fukui et al.
(Continued)

FOREIGN PATENT DOCUMENTS

| CN | 1725233 A | 1/2006 |
|---|---|---|
| JP | 2003-243785 A | 8/2003 |

(Continued)

OTHER PUBLICATIONS

Sato et al. (JP2010-182137) English translation.*
(Continued)

*Primary Examiner* — Steven T Sawyer
(74) *Attorney, Agent, or Firm* — Andrew D. Fortney; Central California IP Group, P.C.

(57) ABSTRACT

Disclosed is a wired electrode of touch screen panel for transmitting a touch signal sensed by a signal sensing pattern of touch screen panel to an external driving circuit, wherein the wired electrode formed on a substrate includes at least one curved portion, and a plurality of fine protrusions are formed on an inner surface of a groove of a resin layer on the substrate. The groove is filled with a conductive material to form the wired electrode.

2 Claims, 7 Drawing Sheets

(51) Int. Cl.
*H05K 1/02* (2006.01)
*H05K 3/12* (2006.01)

(56) References Cited

U.S. PATENT DOCUMENTS

| | | | |
|---|---|---|---|
| 8,289,294 | B2 | 10/2012 | Wang et al. |
| 8,314,779 | B2 | 11/2012 | Chan et al. |
| 8,319,747 | B2 | 11/2012 | Hotelling et al. |
| 2006/0017707 | A1 | 1/2006 | Fukui et al. |
| 2007/0097154 | A1 | 5/2007 | Kojima |
| 2009/0057156 | A1* | 3/2009 | Haba .......... C23C 18/1608 205/118 |
| 2009/0120660 | A1* | 5/2009 | Park .......... H05K 3/045 174/110 R |
| 2009/0272562 | A1* | 11/2009 | Yoshioka .......... H05K 1/162 174/250 |
| 2010/0149108 | A1 | 6/2010 | Hotelling et al. |
| 2010/0214232 | A1 | 8/2010 | Chan et al. |
| 2011/0096005 | A1 | 4/2011 | Kim et al. |
| 2011/0109579 | A1 | 5/2011 | Wang et al. |
| 2011/0141036 | A1 | 6/2011 | Hsu |
| 2012/0086649 | A1* | 4/2012 | Chu .......... G06F 3/041 345/173 |

FOREIGN PATENT DOCUMENTS

| | | |
|---|---|---|
| JP | 2008-77332 | 4/2008 |
| JP | 2009-251642 | 10/2009 |
| JP | 3160062 U | 6/2010 |
| JP | 2010-182137 | 8/2010 |
| KR | 1020090065896 A | 6/2009 |
| KR | 2011-0044463 | 4/2011 |
| TW | 2010005611 A | 2/2010 |
| TW | 201102900 A | 1/2011 |
| WO | 2012173420 A3 | 12/2012 |

OTHER PUBLICATIONS

Patent Abstracts of Japan, Publication No. 2008-077332, Published Apr. 3, 2008, JPO, Japan.
Patent Abstracts of Japan, Publication No. 2009-251642, Published Oct. 29, 2009, JPO, Japan.
Patent Abstracts of Japan, Publication No. 2010-182137, Published Aug. 19, 2010, JPO, Japan.
Abstract of JP2003243785 A; "Resin Bonding Copper-Foil, Copper-Foil/Resin Bonded Film, and Method of Manufacturing Resin Bonding Copper-Foil"; Aug. 29, 2003; Kiyofuji Masahiro; Japanese Patent Office, Tokyo, Japan.
Hattie Spetla; "TPD12S015 PCB Layout Guidelines"; SLVA430—Sep. 2010; Texas Instruments Incorporated; http://www.ti.com/lit/an/slva430/slva430.pdf; 14 pgs.
Bibliographic Data for Chinese Application No. CN1725233; Jan. 25, 2006; Fukui Toshiharu; Touch Screen; 1 pg.; http://worldwide.espacenet.com.
Office Action with English translation dated Jan. 22, 2016; Taiwan Patent Application No. 101121176; 15 pgs.; Taiwan Intellectual Property Office, Taipei, Republic of China.
Stephen Wing-Chi Chan et al.; "Method and Apparatus for Operating a of Touch Panel"; Abstract of TW2021102900 (A); Jan. 1, 2016; http://worldwide.espacenet.com.
Hsin-Hsien Tseng; "The Touch Screen and the Manufacturing Method Thereof"; Abstract of TW2021105611 (A); Feb. 1, 2010 http://worldwide.espacenet.com.
"Substrate for Touch Panel and Touch Panel"; Bibliographic Data of JP3160062 (U); Jun. 10, 2010; http://worldwide.espacenet.com.
Nak Hoon Seong; Film Substrate Including Fine Circuits Capable of Manufacturing Reliably the Fine Circuits on a Thin and Soft Film Instead of a Head Substrate and a Manufacturing Method Thereof; Bibliographic Data of KR1020090065896 (A); Jun. 23, 2009; http://kipo.go.kr.

* cited by examiner

[A]

[B]

[A]

[b]

WIRED ELECTRODE OF TOUCH SCREEN PANEL

TECHNICAL FIELD

The present invention relates to a wired electrode of touch screen panel, and more particularly, to a wired electrode for transmitting a touch signal sensed by a signal sensing pattern of a touch screen panel to an external driving circuit, wherein the wired electrode includes curved portions or fine protrusions.

BACKGROUND ART

Generally, a touch screen panel is an input device that allows a user to input commands by selecting instruction contents on a screen of an image display device through the use of hand or object.

For this, the touch screen panel is provided on a front face of the image display device, wherein the touch screen panel converts a contact location being in direct contact with the user's hand or object into electrical signals. Thus, the instruction contents selected at the contact location may be accepted as an input signal.

The touch screen panel can replace a separate input device, which is operated while being connected with the image display device, for example, keyboard and mouse, whereby an application field of the touch screen panel expands gradually.

A method for realizing the touch screen panel may be classified into a resistive type, capacitive type, and electromagnetic type. Among the above, two of the most typical types may be the resistive type and capacitive type.

The touch screen panel of resistive type is formed of two substrates coated with transparent electrode. When the touch screen panel of resistive type is touched (or pressed) by the use of finger or pen, corresponding portions of the two substrates being at the touch point are attached to each other, to thereby detect the location of the touch. However, an application field of the resistive type has been reduced due to disadvantages such as difficulty of operation and inaccuracy in detecting the location of the touch.

In case of the capacitive type, when a human's hand or an object is touched thereon, a signal sensing pattern senses a change of capacitance by other signal sensing patterns or grounding electrode, whereby the location of the touch is changed into an electrical signal. That is, it uses a principle of sensing static electricity of human body. This capacitive type touch screen panel has good durability, good transmittance, and rapid response time. Recently, the capacitive type touch screen panel has been widely used.

In case of the capacitive type touch screen panel, the signal sensing patterns for sensing the location of the touch, for example, a location touched by a user's finger occupy the most of screen; and a wired electrode for transmitting the touch signal sensed by the signal sensing patterns to an external driving circuit for driving electronic equipment with the touch screen panel is positioned in the margin of screen.

However, a wired electrode of touch screen panel according to the related art has the following problems, which will be explained with reference to FIG. 1 (FIG. 1 illustrates a wired electrode of touch screen panel according to the related art).

As shown in FIG. 1, the related art touch screen panel includes signal sensing patterns 1 and 2 for sensing a user's touch signal, and wired electrodes 10, 30 and 50 for transmitting the sensed touch signal to an external driving circuit (not shown), wherein the signal sensing patterns 1 and 2 are provided in the center of substrate 100. In more detail, the wired electrodes are formed of a contact part 10 connected with the signal sensing patterns 1 and 2, a bonding part 50 electrically connected with the external driving circuit, and a signal transmitting part 30 for connecting the contact part 10 and bonding part 50 with each other. The wired electrodes enable to transmit electrical signals by forming a groove in the substrate 100 and filling the groove with a conductive material.

In this case, in order to form the groove in the substrate 100, a demolding process is carried out by the use of embossing mold whose shape corresponds to the groove. In case of the related art, the signal transmitting part 30 of the wired electrode is provided with a folded portion 11. Also, an embossing portion corresponding to the folded portion 11 is provided in the embossing mold for the demolding process. This embossing portion of the mold may be broken during the demolding process.

Also, since the wired electrode is formed by filling the simple-shaped groove with the conductive material, the filled conductive material may be easily separated during a process for manufacturing the touch screen panel. In this case, the touch signal sensed by the signal sensing patterns 1 and 2 is not transmitted to the external driving circuit.

DISCLOSURE

Technical Problem

Therefore, the present invention has been made in view of the above problems, and it is an object of the present invention to provide a wired electrode of touch screen panel, which prevents an embossing mold for forming a wired electrode of a groove in a resin layer deposited on a substrate of touch screen panel from being broken for a demolding process, and obtains filling stability when the groove is filled with a conductive material by the use of doctor blade.

Another object of the present invention is to provide a wired electrode including a plurality of fine protrusions to prevent a conductive material from being separated from a groove of a substrate for forming the wired electrode of touch screen panel.

Additional advantages, objects, and features of the invention will be set forth in part in the description which follows and in part will become apparent to those having ordinary skill in the art upon examination of the following or may be learned from practice of the invention.

Technical Solution

To achieve these objects and other advantages and in accordance with the purpose of the invention, as embodied and broadly described herein, there is provided a wired electrode of a touch screen panel for transmitting a touch signal sensed by a signal sensing pattern of the touch screen panel to an external driving circuit, the wired electrode formed on a substrate and comprising at least one curved portion.

The wired electrode may comprise a conductive material in a groove of a resin layer on the substrate.

A plurality of fine protrusions may be formed on an inner surface of the groove to prevent the conductive material from being separated from the groove.

Portions of the resin layer inside the groove may protrude to form the fine protrusions.

The wired electrode of touch screen panel may comprise a contact part electrically connected with the signal sensing pattern, a bonding part electrically connected with the external driving circuit, and a signal transmitting part for connecting the contact part and bonding part with each other, the signal transmitting part including the curved portion.

Herein, a line width of the bonding part may be larger than a line width of the signal transmitting part.

The contact part, bonding part, and signal transmitting part may be formed by forming a resin layer on the substrate, forming grooves on the resin layer, and filling the grooves with a conductive material.

A plurality of fine protrusions may be formed on an inner surface of at least one of the grooves of the contact part, bonding part, and signal transmitting part, to thereby prevent the conductive material from being separated from the groove.

Portions of the resin layer inside the groove protrude to form the fine protrusions.

A horizontal cross-sectional area of the fine protrusion in the groove of the bonding part may be larger than a horizontal cross-section area of the fine protrusion in the groove of the signal transmitting part.

According to another aspect of the present invention, there is provided a wired electrode of touch screen panel for transmitting a touch signal sensed by a signal sensing pattern of the touch screen panel to an external driving circuit, the wired electrode comprising a conductive material in a groove of a resin layer on a substrate, wherein a plurality of fine protrusions are formed on an inner surface of the groove.

Portions of the resin layer inside the groove may protrude to form the fine protrusions.

Also, the wired electrode of touch screen panel may comprise: a contact part electrically connected with the signal sensing pattern; a bonding part electrically connected with the external driving circuit, the bonding part including at least one of the fine protrusions; and a signal transmitting part for connecting the contact part and bonding part with each other, the signal transmitting part including at least one of the fine protrusions.

A line width of the bonding part may be larger than a line width of the signal transmitting part, and a horizontal cross-section area of the fine protrusion of the bonding part may be larger than a horizontal cross-section area of the fine protrusion of the signal transmitting part.

Advantageous Effects

According to the present invention, a wired electrode of touch screen panel includes at least one curved portion instead of a folded portion of the related art, to thereby prevent an embossing mold for forming a groove pattern on a resin layer formed on a substrate the touch screen panel from being broken during a molding process. According to the present invention, the groove can be steadily and stably filled with a conductive material by means of doctor blade since the wired electrode of the present invention has no folded portion.

Further, the wired electrode of touch screen panel comprises a plurality of fine protrusions so that a conductive material in a groove on a substrate is prevented from being separated from the groove. Thus, according to the present invention, the signal sensed by the touch screen panel can be transmitted without error to an external driving circuit of an electronic application having a touch screen pad.

BEST MODE

Reference will now be made in detail to the preferred embodiments of the present invention, examples of which are illustrated in the accompanying drawings. On explanation about the embodiments of the present invention, if it is mentioned that a first structure is connected with a second structure, it should be understood that the first and structures are brought into direct contact with each other, or a third structure is interposed between the first and second structures. Wherever possible, the same reference numbers will be used throughout the drawings to refer to the same or like parts. Herein, the structure and effects of the present invention to be described and explained with reference to the accompanying drawings may be at least one embodiment, that is, the technical idea and main structure and effects of the present invention will not be limited to the following description.

First, a wired electrode of touch screen panel according to one embodiment of the present invention will be described as follows.

FIGS. 2 to 5 illustrate a wired electrode of touch screen panel according to one embodiment of the present invention.

Figure 2:
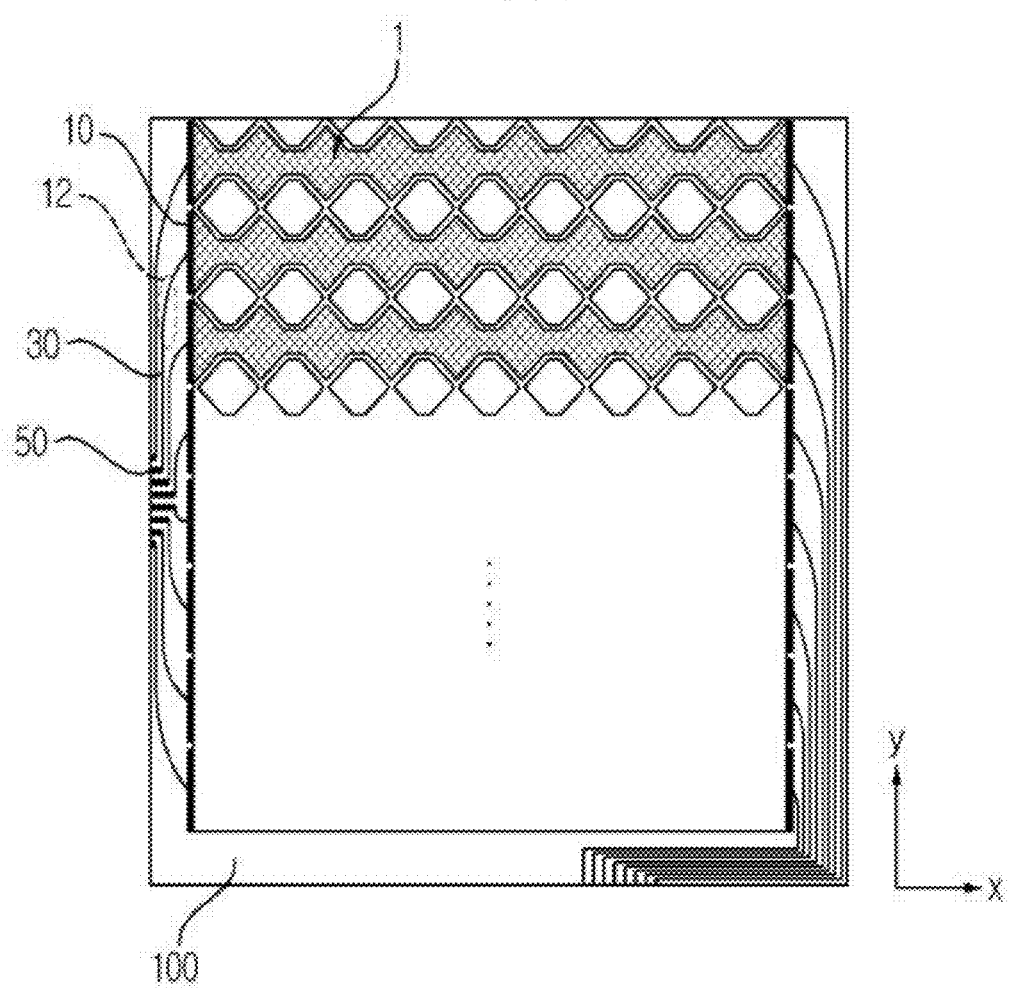
FIGS. 2 to 5 illustrate a wired electrode of touch screen panel according to one embodiment of the present invention.

As shown in FIG. 2, the wired electrode of touch screen panel according to one embodiment of the present invention is formed on one surface of an substrate 100. The substrate 100 means a base member in the form of a plate or a film and may be formed of various materials, without limitation, e.g., a transparent material, a glass material, a plastic material, and etc.

The wired electrode includes a contact part 10 electrically connected with a signal sensing pattern 1; a bonding part 50 for transmitting a touch signal sensed by the signal sensing pattern 1 to an external driving circuit (not shown); and a signal transmitting part 30 for connecting the contact part 10 and bonding part 50 with each other.

The contact part 10 is a pad being in contact with one end of the signal sensing pattern 1, wherein the contact part 10 is formed of a conductive material enabling transmission of electrical signal.

The bonding part 50 is formed on an end part of the substrate 100 to transmit the electrical signal to the external driving circuit (not shown). A line width of the bonding part 50 may be larger than a line width of the signal transmitting part 30. This structure is provided to stably connect a corresponding connection device (not shown), designed to be connected with the bonding part 50, to the bonding part 50. The connection device (not shown) is provided with a conductive connection line corresponding to the bonding part 50. When the conductive connection line and bonding part 50 have slightly large line width in comparison with a minute line width of the signal transmitting part 30, a more stable electrical connection can be realized.

The signal transmitting part 30 is a line for connecting the aforementioned contact part 10 and bonding part 50, wherein the signal transmitting part 30 is formed of a conductive material enabling transmission of the electrical signal between the contact part 10 and bonding part 50. The signal transmitting part 30 includes at least one curved portion 12.

The curved portion 12 is formed by gently curving the signal transmitting part 30. A curvature degree of the signal transmitting part 30 in the curved portion 12 may be changed freely.

Figure 1:
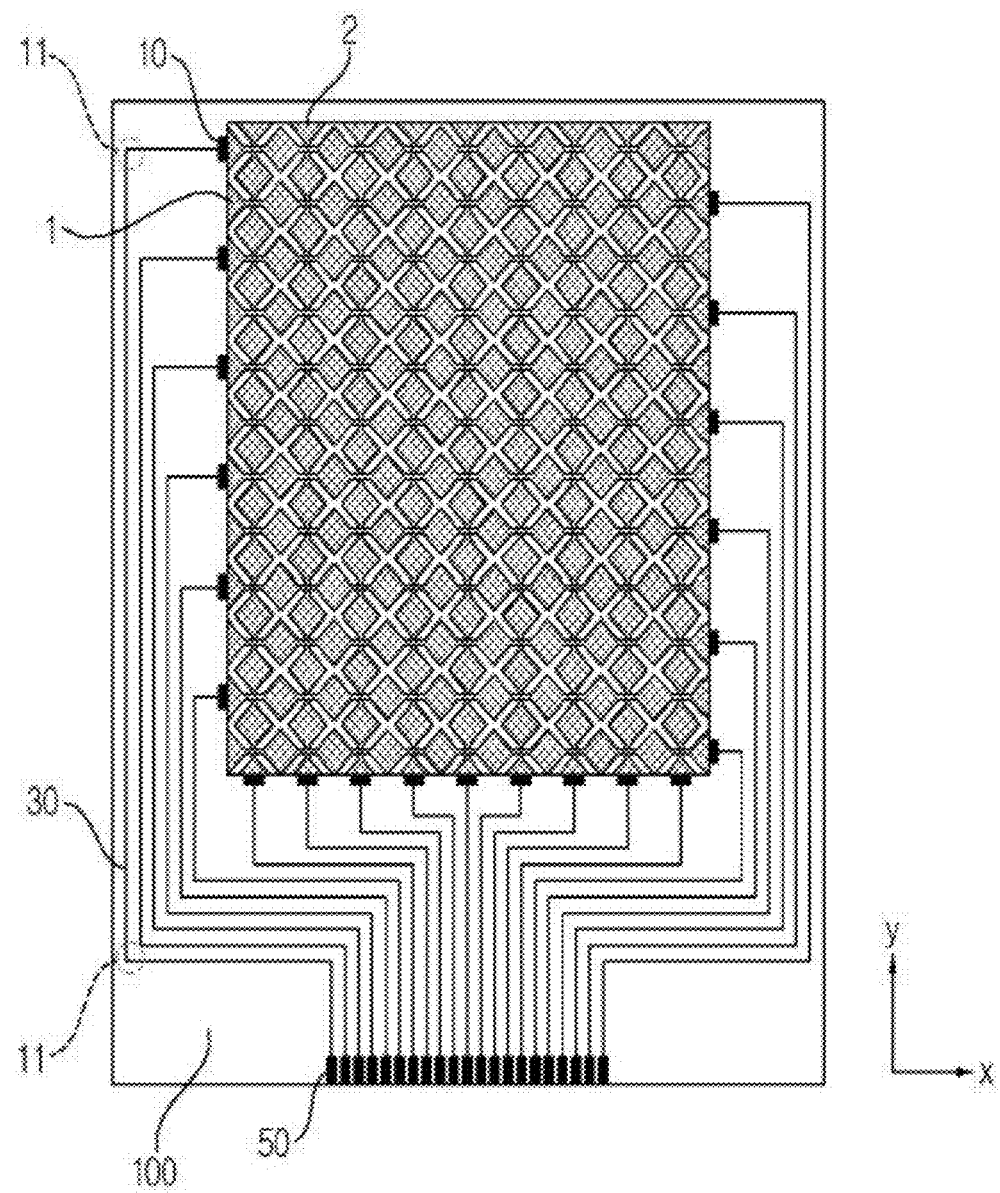
FIG. 1 illustrates a wired electrode of touch screen panel according to the prior art.
Figure 3:
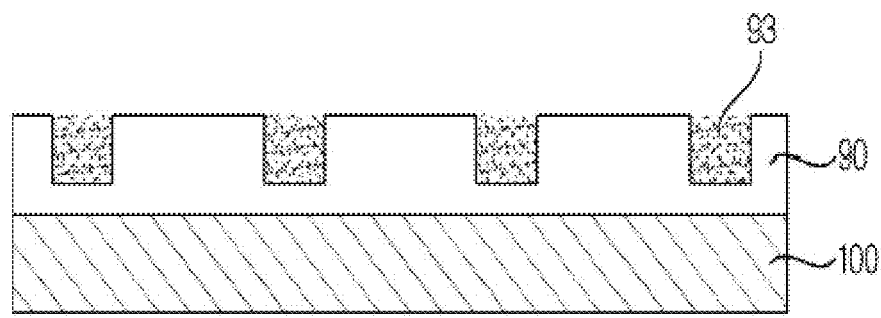
Figure 4:
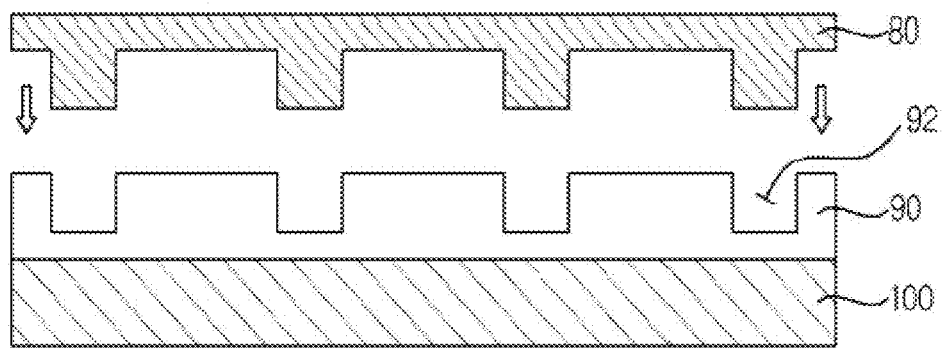

The reason why the curved portion 12 is formed in the signal transmitting part 30 will be explained with reference to FIGS. 3 and 4. A wired electrode including the contact part 10, signal transmitting part 30, and bonding part 50 is formed by forming a resin layer 90 on the substrate 100, forming grooves 92 on the resin layer 90, and filling the grooves 92 with a conductive material 93. Thus, the grooves 92 in which the wired electrode is to be formed are formed in the resin layer 90 on the substrate 100. In order to form the grooves 92, an embossing mold 80 whose shape corresponds to the grooves 92 is used. In this case, the embossing mold with minute lines is used so as to form, on the resin layer 90, the grooves 92 in which the signal transmitting part 30 of minute lines is to be formed. In case of the related art, however, since a signal transmitting part 30 has a folded portion (See '11' of FIG. 1) of right angle, an embossing portion of the embossing mold 80 has been easily broken during the molding process. In order to overcome this problem, the wired electrode according to one embodiment of the present invention includes at least one curved portion 12 and has no folded portion at the signal transmitting part 30.

Another reason why the signal transmitting part 30 has the curved portion 12 will be explained with reference to FIG. 5.

Figure 5:
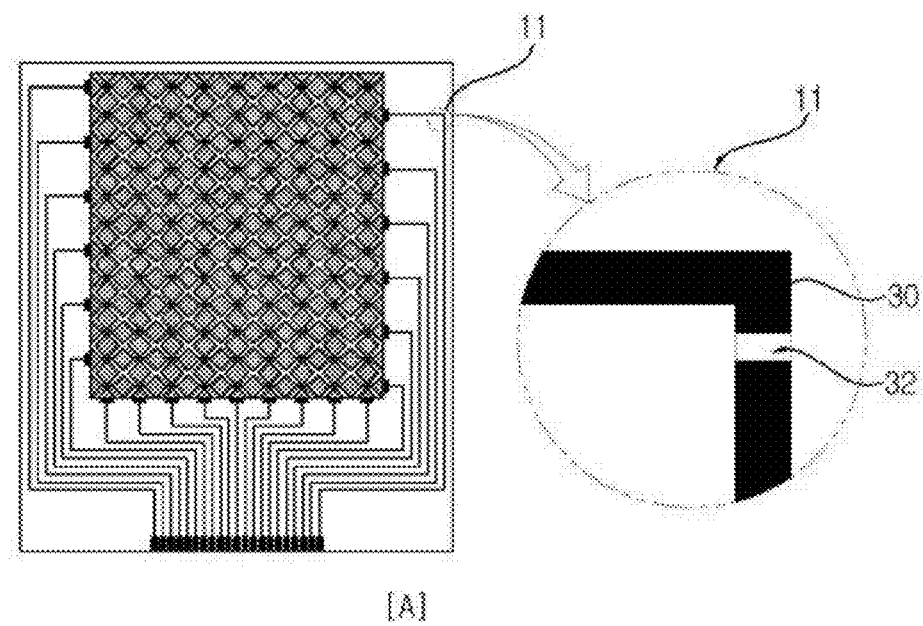
Figure 5:
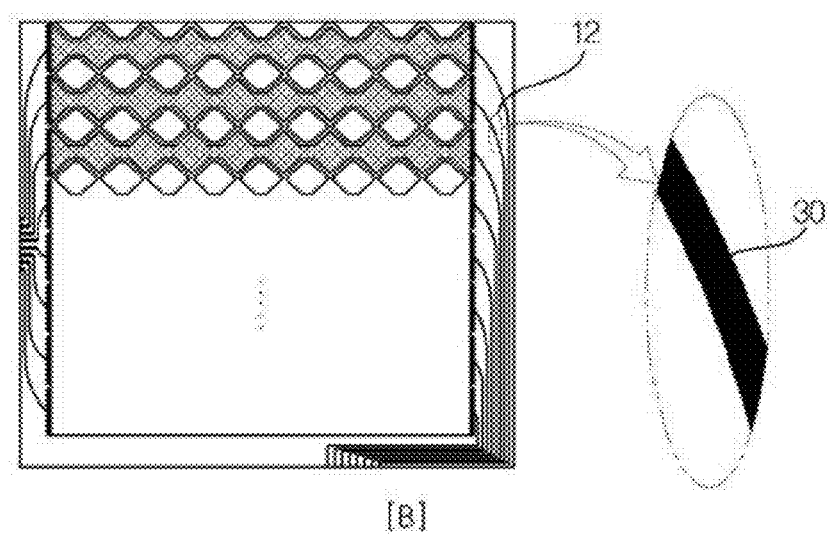

In FIG. 5, (A) illustrates a conductive material in the groove of the wired electrode having a shape folded at right angle; and (B) illustrates a conductive material in the groove of the wired electrode having a curved portion.

In (A) of FIG. 5, the groove is filled with the conductive material to form the signal transmitting part 30. However, since the signal transmitting part 30 is folded at right angle, a non-filled portion 32, which is not filled with the conductive material, may be provided in some areas of the signal transmitting part 30. Thus, (A) may have a problem related with a low stability in filling of the conductive material.

Meanwhile, as shown in (B) which illustrates that the curved portion is included in the wired electrode having the structure according to the present invention, the signal transmitting part 30 is completely filled with the conductive material because a folded portion is not included in the wired electrode. Thus, the non-filled portion is not formed in the wired electrode according to the present invention, which enables the more stable signal transmission.

Hereinafter, another embodiment of the present invention will be explained as follows.

Figure 6:
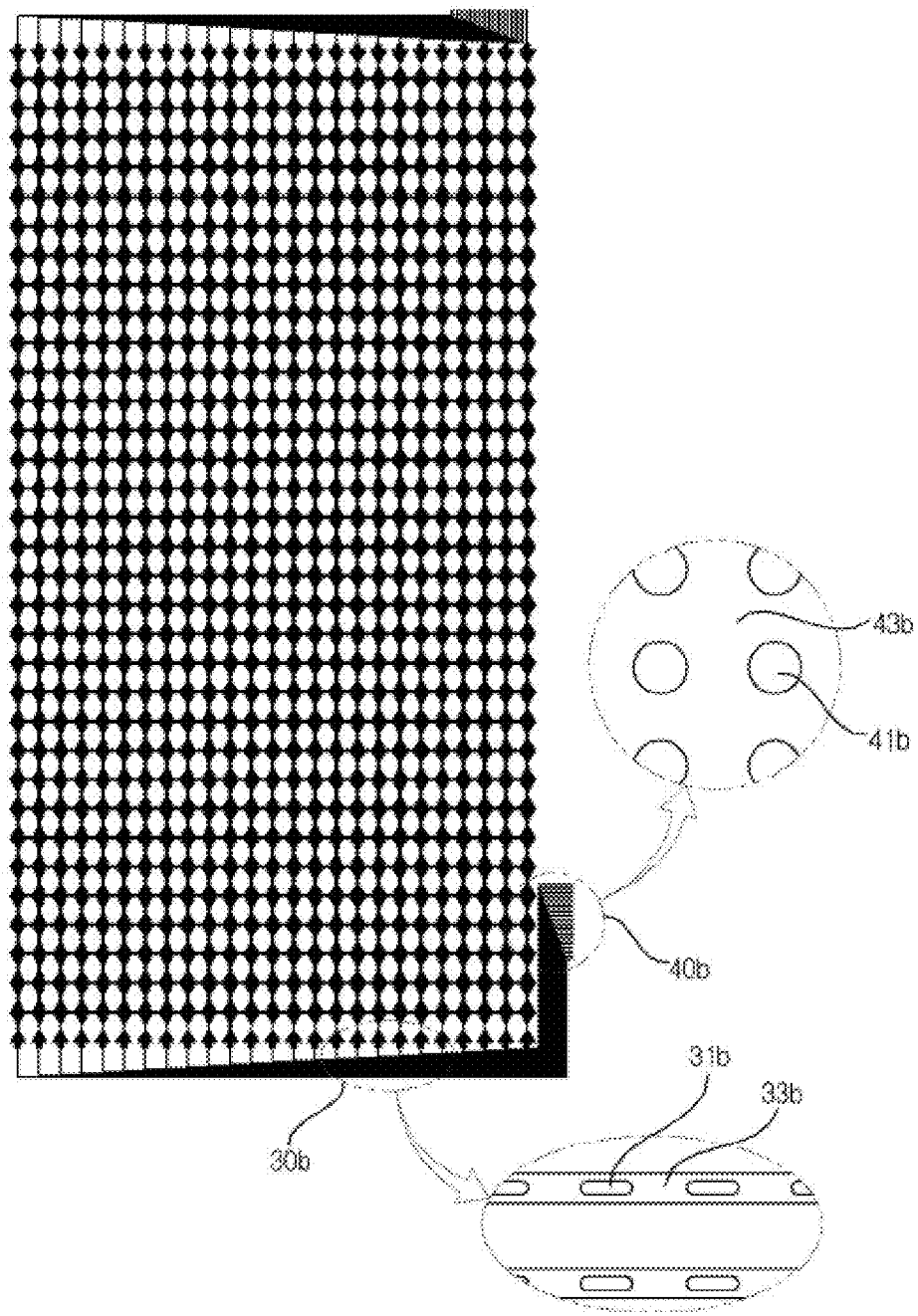
FIG. 6 illustrates a wired electrode of touch screen panel according to another embodiment of the present invention.
Figure 7:
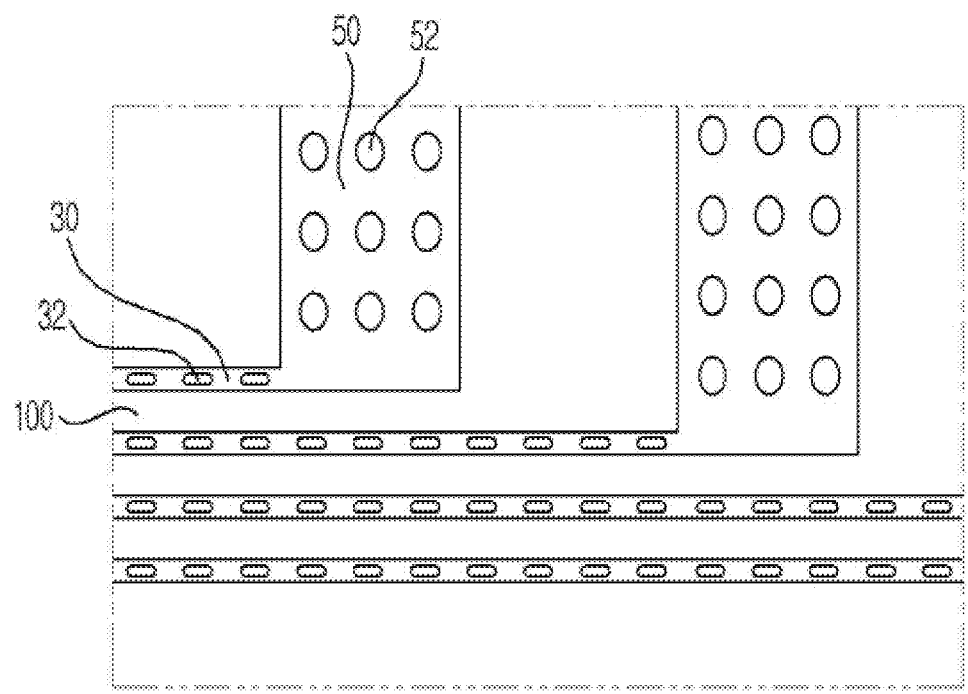
FIG. 7 illustrates an example of an arrangement of the wired electrode shown in FIG. 6.

FIG. 6 illustrates a wired electrode of touch screen panel according to another embodiment of the present invention. FIG. 7 illustrates an arrangement example of wired electrode shown in FIG. 3.

Referring to FIGS. 6 and 7, the wired electrode of touch screen panel according to another embodiment of the present invention includes fine protrusions 32 and 52. In more detail, the plurality of fine protrusions 32 and 52 may be formed in each of signal transmitting part 30 and bonding part 50 of the wired electrode according to another embodiment of the present invention. The fine protrusions 32 and 52 are formed inside a groove for formation of the aforementioned wired electrode. The fine protrusions 32 and 52 are formed by protrusion of partial portions of the resin layer (See '90' of FIG. 3) deposited on a substrate inside the groove. In this case, the fine protrusions 32 and 52 are formed by the use of aforementioned mold. Preferably, the fine protrusions 32 and 52 are formed simultaneously with the groove which is formed in the resin layer by the embossing portion of the mold. That is, groove patterns for formation of the fine protrusions 32 and 52 are provided in the embossing portion of the mold, to thereby form the groove in the resin layer, and simultaneously form the fine protrusions 32 and 52 inside the groove.

The reason why the fine protrusions 32 and 52 are formed will be explained. As mentioned in the above embodiment of the present invention, in order to form the wired electrode, the groove is formed in the resin layer (See '90' of FIG. 3) of the substrate 100, and the groove is filled with the conductive material. In this case, the conductive material being in a paste state is filled in the groove, and is then cured by a curing process, whereby the cured conductive material functions as the wired electrode. Herein, a line width of the signal transmitting part 30 and bonding part 50 of the wired electrode is larger than a line width of grid forming the signal sensing pattern, whereby the conductive material is easily separated.

That is, a process for manufacturing the touch screen panel includes a cleaning step of the substrate 100, or a squeezing step using a doctor blade. During these steps, the conductive material filled in the groove of the resin layer (See FIG. 3) of the substrate may be separated from the groove.

Thus, according to another embodiment of the present invention, the plurality of fine protrusions 32 and 52 are formed in the signal transmitting part 30 and bonding part 50 of the wired electrode, to thereby prevent the separation of conductive material. That is, if forming the fine protrusions 32 and 52 inside the groove of the wired electrode, its line width becomes larger than the grid of signal sensing pattern so that it is possible to prevent the separation of conductive material during the process for manufacturing the touch screen panel. Accordingly, the plurality of fine protrusions 32 and 52 enable to reduce the line width of signal transmitting part 30 and bonding part 50, and simultaneously to bring the conductive material into contact with the surface of fine protrusions 32 and 52, to thereby prevent the separation of conductive material.

A thickness of the conductive material filled in the groove will be explained with reference to FIG. 8.

Figure 8:
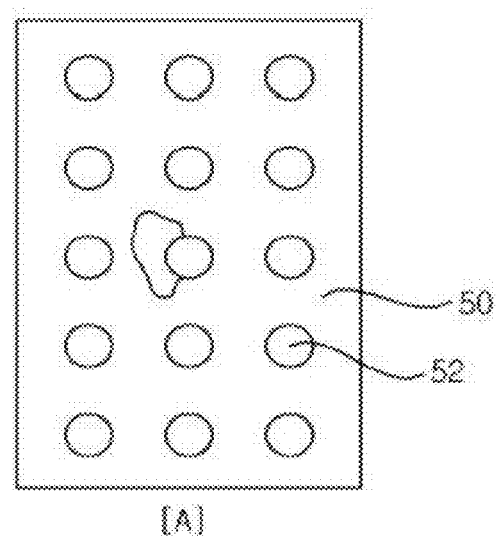
FIG. 8 illustrates a conductive material in the wired electrode.
Figure 8:
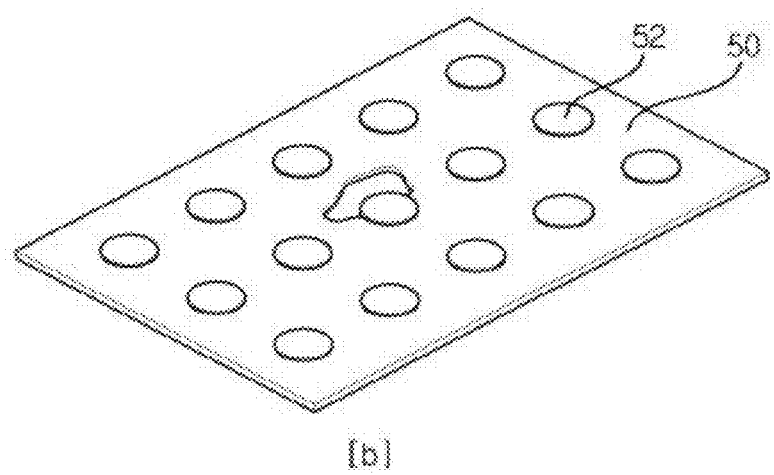

In FIG. 8, (A) is a plane view illustrating the filling state of conductive material filled in the groove and fine protrusion of the wired electrode, and (B) is a perspective view thereof.

As shown in (A) and (B) of FIG. 8, the conductive material may be filled in such a manner that a height of the fine protrusion 52 becomes the same as a height of the electrode formed by filling the conductive material in the groove, or a height of the electrode becomes lower than a height of the fine protrusion 52. Thus, the conductive material filled in the bonding part 50 is brought into close contact with the fine protrusion 52, to thereby prevent the conductive material from being separated from the bonding part 50, and to obtain good stability in filling of the wired electrode. FIG. 8 illustrates the fine protrusion 52 formed in the bonding part 50 of FIG. 7. However, it can be identically applied to the fine protrusion 32 formed in the signal transmitting part 30 of FIG. 7.

Meanwhile, the fine protrusions 32 and 52 may vary in shape. For example, a cross-sectional shape of the fine protrusion 32 and 52 may be a circle, triangle, rectangle, semi-ellipse, semi-circle, ellipse, and etc. Various cross-sectional shapes of the fine protrusions 32 and 52 can increase a contact area to be in contact with the conductive material, to thereby improve a filling stability and prevent the separation of conductive material. Preferably, the fine protrusions may be formed in shape of cylinder or cylindroid.

Also, the plurality of fine protrusions 32 provided in the signal transmitting part 30 may be arranged along the signal transmitting part 30. In the same manner as the plurality of fine protrusions 32 provided in the signal transmitting part 30, the shape and arrangement of the plurality of fine protrusions 52 provided in the bonding part 50 may vary.

However, since a line width of the bonding part 50 is larger than a line width of the signal transmitting part 30, it is preferable that a horizontal cross-sectional area of the fine protrusion 52 provided in the bonding part 50 be larger than a horizontal cross-section area of the fine protrusion 32 provided in the signal transmitting part 30. Herein, the horizontal cross-section area indicates an area of horizontal cross section of the fine protrusion 32 and 52 when the fine protrusion 32 and 52 is cut while being parallel with the resin layer.

Another embodiment of the present invention will be explained as follows.

According to another embodiment of the present invention, a wired electrode of touch screen panel includes at least one curved portion, and a plurality of fine protrusions. In more detail, the curved portion 12 is formed in the signal transmitting part 30 of the wired electrode, and the fine protrusions 32 and 52 are formed in each of the signal transmitting part 30 and bonding part 50.

This embodiment of the present invention can be realized by combining the properties of the wired electrodes of touch screen panel according to the aforementioned two embodiments of the present invention. This will be easily understood by those skilled in the art, whereby a detailed explanation will not be added.

The present invention has been described in the limited embodiments and drawings, however, it is not limited to the above. It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A wired electrode of touch screen panel for transmitting a touch signal sensed by a signal sensing pattern of the touch screen panel to an external driving circuit, the wired electrode comprising a conductive material in a groove of a resin layer on a substrate, wherein a plurality of fine protrusions are formed on an inner surface of the groove, wherein the wired electrode of the touch screen panel comprises:

a contact part electrically connected with the signal sensing pattern;

a bonding part electrically connected with the external driving circuit, the bonding part being in contact with at least one of the fine protrusions; and a signal transmitting part for connecting the contact part and bonding part with each other, the signal transmitting part being in contact with at least one of the fine protrusions, and wherein a line width of the bonding part is larger than a line width of the signal transmitting part, and a horizontal cross-section area of the fine protrusion corresponding to the bonding part is larger than a horizontal cross-section area of the fine protrusion corresponding to the signal transmitting part.

2. The wired electrode according to claim 1, wherein portions of the resin layer inside the groove protrude to form the fine protrusions.

* * * * *